(12) United States Patent
Cohen (10) Patent No.: US 7,902,540 B2
(45) Date of Patent: Mar. 8, 2011

(54) FAST P-I-N PHOTODETECTOR WITH HIGH RESPONSITIVITY

(75) Inventor: Guy M. Cohen, Mohegan Lake, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/124,617

(22) Filed: May 21, 2008

(65) Prior Publication Data

US 2009/0289320 A1    Nov. 26, 2009

(51) Int. Cl.
*H01L 29/72* (2006.01)
(52) U.S. Cl. .......... 257/9; 257/401; 257/428; 257/436; 257/448; 257/458; 257/465; 257/466; 257/656; 977/749; 977/763; 977/932; 136/251; 427/74
(58) Field of Classification Search .......... 257/9, 401, 257/428, 436, 448, 458, 465, 466, 656; 136/251; 427/74; 977/749, 763, 932
See application file for complete search history.

(56) References Cited

U.S. PATENT DOCUMENTS

| | | | |
|---|---|---|---|
| 6,087,197 A | 7/2000 | Eriguchi et al. | |
| 6,177,289 B1 | 1/2001 | Crow et al. | |
| 6,451,702 B1 | 9/2002 | Yang et al. | |
| 6,996,147 B2 | 2/2006 | Majumdar et al. | |
| 7,095,006 B2 | 8/2006 | Yang | |
| 7,112,465 B2 | 9/2006 | Goushcha et al. | |
| 7,138,697 B2 | 11/2006 | Chu et al. | |
| 2003/0089899 A1 | 5/2003 | Lieber et al. | |
| 2004/0075464 A1* | 4/2004 | Samuelson et al. | 326/37 |
| 2005/0227391 A1 | 10/2005 | Jin et al. | |
| 2005/0230356 A1 | 10/2005 | Empedocles et al. | |
| 2006/0214172 A1 | 9/2006 | Hsu et al. | |
| 2008/0135089 A1* | 6/2008 | Tsakalakos et al. | 136/248 |
| 2008/0169019 A1* | 7/2008 | Korevaar et al. | 136/251 |

OTHER PUBLICATIONS

Guarini, K.W., et al., "Low voltage, scalable nanocrystal FLASH memory fabricated by templated self assembly," IEDM 2003, p. 541, 2003.

* cited by examiner

*Primary Examiner* — Edward Wojciechowicz
(74) *Attorney, Agent, or Firm* — Scully, Scott, Murphy & Presser, P.C.; Vazken Alexanian (57) ABSTRACT

A lateral p-i-n photodetector is provided that includes an array of vertical semiconductor nanowires of a first conductivity type that are grown over a semiconductor substrate also of the first conductivity type. Each vertically grown semiconductor nanowires of the first conductivity type is surrounded by a thick epitaxial intrinsic semiconductor film. The gap between the now formed vertically grown semiconductor nanowires-intrinsic semiconductor film columns (comprised of the semiconductor nanowire core surrounded by intrinsic semiconductor film) is then filled by forming an epitaxial semiconductor material of a second conductivity type which is different from the first conductivity type. In a preferred embodiment, the vertically grown semiconductor nanowires of the first conductivity type are n+ silicon nanowires, the intrinsic epitaxial semiconductor layer is comprised of intrinsic epitaxial silicon, and the epitaxial semiconductor material of the second conductivity type is comprised of p+ silicon.

13 Claims, 3 Drawing Sheets

FAST P-I-N PHOTODETECTOR WITH HIGH RESPONSITIVITY

FIELD OF THE INVENTION

The present invention relates to a semiconductor structure and a method of fabricating the same. More particularly, the present invention relates to a fast photodetector having high responsitivity and a method of fabricating such a photodetector. Even more particularly, the present invention relates to a fast p-i-n photodetector having high responsivity using nanowire electrodes that are vertically oriented relative to a surface of an underlying semiconductor substrate.

BACKGROUND OF THE INVENTION

The absorption length of 850 nm light in silicon is 15-20 microns, which is much longer than the 1-2 microns absorption length of typical III-V compound semiconductors such as GaAs at this wavelength. As a result, high speed silicon photodetectors are often designed with a lateral structure, rather than a vertical structure, in an attempt to decouple the photocarrier transient time from the absorption length and to minimize the complexity of fabricating large scale features, since semiconductor processing is typically optimized for thin film (<<1 μm) features.

These lateral structures typically take the form of either (1) a p-i-n detector with diffused or implanted fingers, or (2) a metal-semiconductor-metal (MSM) detector. In such lateral structures, the electric field is high at the surface of the semiconductor and decreases at lower depths. Photocarriers that are generated deep below the surface of the semiconductor experience a weak electric field and slowly drift up to the contacts. These slow carriers create a low frequency tail in the frequency response that limits the bandwidth of the device to be less than 1 GHz in silicon. This effect can somewhat be minimized by using a lateral trench detector (LTD) structure.

U.S. Pat. No. 6,177,289 to Crow et al. provides one such LTD structure. The LTD structure is formed within a plurality of substantially parallel trenches that are etched into a substrate. The trenches are further formed as a plurality of alternating n-type and p-type trench regions separated by pillar regions of the substrate which operate as an intrinsic (i) region between the n and p trench regions. First and second contacts are formed on the surface of the substrate and interconnect the n-type trench regions and the p-type trench regions, respectively. Preferably, the trenches are etched with a depth comparable to an optical extinction length of optical radiation to which the detector is responsive.

U.S. Pat. No. 6,451,702 to Yang et al. provides another LTD structure. In particular, Yang et al. provides a method of forming a LTD structure which includes forming a first set and a second set of trenches in a substrate, wherein trenches of the first set are alternately disposed with respect to trenches of the second set, filling the trenches with a sacrificial material, and etching the sacrificial material from the first set of trenches. The method further includes filling the first set of trenches with a doped material of a first conductivity, etching the sacrificial material from a second set of trenches, filling the second set of trenches with a doped material of a second conductivity, forming a first junction layer by driving dopants from the doped material in each of the first set of trenches and forming a second junction layer by driving dopants from the doped material in each of the second set of trenches, and providing separate wiring connections to the first set of trenches and the second set of trenches. The first and second sets of trenches are formed simultaneously.

The prior art LTD structures such as described, for example, in Crow et al. and Yang et al. are based on DRAM (dynamic random access memory) capacitor trenches that are filled with p-type and n-type polysilicon to form a lateral p-i-n structure. The trenches are typically formed by reactive ion etching (RIE). Typical trenches can be 100 nm wide and about 8 microns deep. Since n-type and p-type filled trenches are needed to realize the p-i-n structure, the fabrication process typically requires two RIE steps. Alternatively, all trenches are etched in one RIE step and then filled with a sacrificial material. The sacrificial material is removed from designated p-type trenches to allow p-type filling of the trenches and then the sacrificial material is removed from designated n-type trenches and thereafter filled with a p-type material. Each polysilicon deposition step is typically followed by a chemical mechanical polishing (CMP) step to remove the excess polysilicon from the device top surface.

The LTD structure fabrication requires specialized silicon technology processes, such as high aspect ratio reactive ion etching, in-situ doped polysilicon deposition, and multiple CMP steps. Also, it is more difficult to integrate trenches with semiconductor-on-insulator (SOI) technology due to the presence of the buried insulating layer. Additionally, and on one hand, since the RIE process can produce trenches with finite aspect ratio of depth over width, reducing the trench width will result in shallower trenches and therefore loss of detector responsivity. On another hand, wide trenches reduce the intrinsic silicon available for carrier absorption.

In view of the above, there is a need for providing a new p-i-n structure which is based on the same operation principle used by LTD structures, yet avoids the problems and fabrication complexity of LTD structures.

SUMMARY OF THE INVENTION

The present invention provides a lateral p-i-n photodetector that is based on the same operation principle used by prior art LTD structures, yet has a different structural configuration that avoids the problems and fabrication complexity of prior art LTD structures. The inventive lateral p-i-n photodetector includes an array of vertical semiconductor nanowires of a first conductivity type (i.e., n-type or p-type) that are grown over a semiconductor substrate also of the first conductivity type. Each vertically grown semiconductor nanowire of the first conductivity type is surrounded by a thick epitaxial intrinsic semiconductor film. The gap between the now formed columns comprised of a semiconductor nanowire core surrounded by intrinsic semiconductor film is then filled by forming an epitaxial semiconductor material of a second conductivity type which is different from the first conductivity type. In a preferred embodiment, the vertically grown semiconductor nanowires of the first conductivity type are n+ silicon nanowires, the intrinsic epitaxial semiconductor layer is comprised of intrinsic epitaxial silicon, and the epitaxial semiconductor material of the second conductivity type is comprised of p+ silicon.

The inventive lateral p-i-n photodetector electrodes are comprised of the "core" semiconductor nanowires of the first conductivity type and a "shell" of the epitaxial semiconductor material of the second conductivity type. In between the core and the shell is a thick intrinsic semiconductor film which forms the intrinsic (i.e., "i") region of the lateral p-i-n photodetector. The lateral p-i-n photodetector of the present invention is not formed within DRAM trenches, does not require high aspect ratio RIE and can be integrated easily with bulk or SOI CMOS technology.

The inventive p-i-n photodetector has a long absorption length (defined by the semiconductor nanowire length) for collecting photons without sacrificing detector response time, which is set by roughly half the spacing between each adjacent semiconductor nanowire. It is observed that the semiconductor nanowires of the invention have a length from about 200 to about 20000 nm, and the spacing between each nanowire within an array is from about 100 to about 2000 nm. It is further observed that epitaxial defects (were epi fronts meet) are confined to the epitaxial semiconductor material of the second conductivity type.

In the inventive structure, the bulk of the absorption of photons occurs in the intrinsic semiconductor regions between nanowires. The issue of a large surface area to volume ratio presented by nanowires (which leads to high recombination rate due to the surface recombination) is eliminated in the inventive p-i-n photodetector by passivating the semiconductor nanowires with an epitaxially grown intrinsic semiconductor material and a second conductivity type semiconductor material, which effectively fills the gaps between nanowires and eliminates the nanowires' sidewall surfaces.

In one aspect of the invention, a lateral p-i-n photodetector is provided that comprises:
an array of semiconductor nanowires of a first conductivity type disposed vertically on a surface of an underlying semiconductor substrate of said first conductivity type;
an intrinsic semiconductor material located on said surface of said semiconductor substrate and surrounding each semiconductor nanowire of said array; and
a semiconductor material of a second conductivity type located on a surface of said intrinsic semiconductor material, wherein said second conductivity type is different from said first conductivity type.

In some embodiments of the present invention, the semiconductor substrate is a bulk semiconductor material. In other embodiments of the invention, the semiconductor substrate is a semiconductor-on-insulator (SOI) substrate. When an substrate is employed, the inventive p-i-n photodetector can be formed on the SOI layer (i.e., the top layer) of the SOI substrate. Alternatively, and when an SOI substrate is employed, the p-i-n photodetector of the present invention can be formed on a surface of the bottom semiconductor layer.

In one embodiment of the present invention, the first conductivity type is p-type, while the second conductivity type is n-type. In another embodiment, which is more preferred over the previously mentioned embodiment, the first conductivity type is n-type, while the second conductivity type is p-type.

Notwithstanding the conductivity of the semiconductor nanowires, the semiconductor nanowires have a dopant concentration of the first conductivity type of about $5\times10^{18}$ atoms/cm$^3$ or greater, with a dopant concentration of the first conductivity type from about $1\times10^{19}$ to about $5\times10^{20}$ atoms/cm$^3$ being even more preferred. In a highly preferred embodiment, the semiconductor nanowires of the first conductivity are doped with phosphorus (P) and the concentration of P within the semiconductor nanowires is from about $1\times10^{19}$ to about $5\times10^{20}$ atoms/cm$^3$.

Notwithstanding the conductivity of the semiconductor material of the second conductivity type, the semiconductor material has a dopant concentration of the second conductivity type of about $5\times10^{18}$ atoms/cm$^3$ or greater, with a dopant concentration of the second conductivity type from about $1\times10^{19}$ to about $5\times10^{20}$ atoms/cm$^3$ being even more preferred. In a highly preferred embodiment, the semiconductor material of the second conductivity is doped with boron (B) and the concentration of B within the semiconductor material is from about $1\times10^{19}$ to about $5\times10^{20}$ atoms/cm$^3$. It is also noted that the intrinsic semiconductor material may include a small amount of dopants, incorporated unintentionally in the material. These dopants can be of either n-type or p-type conductivity. The unintentional doping level is typically less than $5\times10^{17}$ atoms/cm$^3$.

The inventive p-i-n photodetector may be used alone or it may be integrated with other types of semiconductor devices including, for example, transistors (including CMOS transistors or bipolar transistors), capacitors, diodes, etc.

In a highly preferred aspect of the present invention, a p-i-n photodetector is provided that comprises:
an array of n-type doped silicon nanowires disposed vertically on a surface of an underlying n-type doped silicon substrate, said n-type doped silicon substrate having a (111) crystal orientation;
a layer of intrinsic silicon located on said surface of said n-type doped silicon substrate and surrounding each n-type doped silicon nanowire of said array; and
a layer of p-type doped silicon located on a surface of said layer of intrinsic silicon.

In some embodiments of this aspect of the present invention, the silicon substrate is a bulk silicon material. In other embodiments of the invention, the silicon substrate is a silicon-on-insulator substrate. When a silicon-on-insulator substrate is employed, the inventive p-i-n photodetector can be formed on the top silicon layer of the silicon-on-insulator substrate. Alternatively, the p-i-n photodetector of the present invention can be formed on a surface of a bottom silicon layer of a silicon-on-insulator substrate.

In another aspect of the invention, a method of fabricating the above described lateral p-i-n photodetector is provided. As stated above, the method of the present invention does not form DRAM trenches, does not require high aspect ratio RIE and can be integrated easily with bulk or SOI CMOS technology. In particular, the inventive method includes:
providing an array of semiconductor nanowires of a first conductivity type disposed vertically on a surface of an underlying semiconductor substrate;
forming an intrinsic semiconductor material on said surface of said semiconductor substrate and surrounding each semiconductor nanowire of said array; and
forming a semiconductor material of a second conductivity type located on a surface of said intrinsic semiconductor material, wherein said second conductivity type is different from said first conductivity type.

It is observed that the dopants that define the first conductivity type and the second conductivity may be introduced in-situ during growth of the semiconductor nanowires and/or the semiconductor material of second conductivity type. Alternatively, the dopants that define the first conductivity type and the second conductivity may be introduced after growth of the semiconductor nanowires and/or the semiconductor material of second conductivity type.

In a highly preferred embodiment of the present invention, a method is provided that comprises:
providing an array of n-type doped silicon nanowires disposed vertically on a surface of an underlying n-type doped silicon substrate, said n-type doped silicon substrate having a (111) crystal orientation;
forming a layer of intrinsic silicon located on said surface of said n-type doped silicon substrate and surrounding each n-type doped silicon nanowire of said array; and
forming a layer of p-type doped silicon located on a surface of said layer of intrinsic silicon.

DETAILED DESCRIPTION OF THE INVENTION

The present invention, which provides a fast p-i-n photodetector with high responsivity and a method of fabricating the same, will now be described in greater detail by referring to the following discussion and drawings that accompany the present application. It is noted that the drawings of the present application are provided for illustrative purposes only and, as such, the drawings are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As stated above, the present invention provides a lateral p-i-n photodetector that is based on the same operation principle used by prior art LTD structures. Despite having the same operation principle used by prior art LTD structures, the inventive photodetector has a different structural configuration that avoids the problems and fabrication complexity of prior art LTD structures. The inventive lateral p-i-n photodetector includes an array of vertical semiconductor nanowires of a first conductivity type that are grown over a semiconductor substrate also of the first conductivity type. Each vertically grown semiconductor nanowire of the first conductivity type is surrounded (on the sidewalls and top surface) by a thick epitaxial intrinsic semiconductor film. The gap between the now formed vertically grown semiconductor nanowires of the first conductivity type-intrinsic semiconductor film columns is then filled by forming an epitaxial semiconductor material of a second conductivity type which is different from the first conductivity type.

In a preferred embodiment, the vertically grown semiconductor nanowires of the first conductivity type are n+ silicon nanowires, the intrinsic epitaxial semiconductor layer is comprised of intrinsic epitaxial silicon, and the epitaxial semiconductor material of the second conductivity type is comprised of p+ silicon.

The inventive lateral p-i-n photodetector electrodes are comprised of the "core" semiconductor nanowires of the first conductivity type and a "shell" of the epitaxial semiconductor material of the second conductivity type. In between the core and the shell is a thick intrinsic semiconductor film which forms the intrinsic (i.e., undoped) region of the lateral p-i-n photodetector. As will be demonstrated herein below, the lateral p-i-n photodetector of the present invention is not formed within DRAM trenches, does not require high aspect ratio RIE and can be integrated easily with bulk or SOI CMOS technology. As such, and since the inventive photodetector is also fast and has a high responsivity, the inventive photodetector represents a significant improvement over prior art photodetectors such as, for example, prior art LTD structures.

The method of the present invention will now be described by referring to FIGS. 1A-1B, FIGS. 2A-2B, and FIGS. 3A-3B. It is observed that in these drawings, the figures designated by "A" are cross sectional views, while the figures designated by "B" are top down views.

Figure 1A:
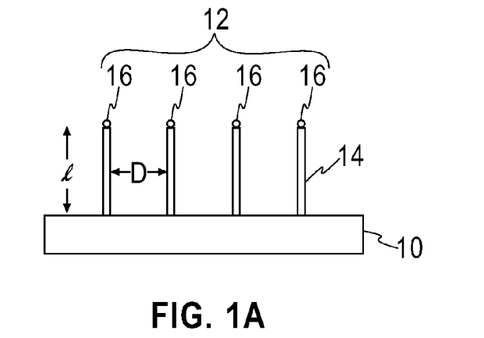
FIGS. 1A-1B are pictorial representations (through a cross sectional view and a top down view, respectively) illustrating a step of growing an array of vertical semiconductor nanowires of a first conductivity type over a semiconductor substrate, in accordance with the present invention.
Figure 1B:
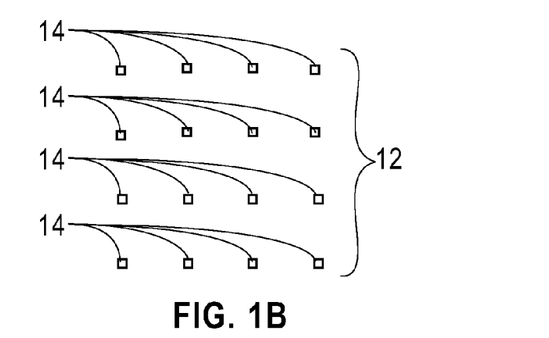

Reference is first made to FIGS. 1A-1B which illustrate the structure that is formed after providing an array 12 of semiconductor nanowires 14 of a first conductivity type disposed vertically on a surface of an underlying semiconductor substrate 10. The underlying semiconductor substrate 10 is also of the first conductivity type; the first conductivity type may be introduced into the substrate before or after nanowire growth. The structure shown in FIGS. 1A-1B also includes catalyst particles 16 that form at a tip of each of the semiconductor nanowires 14 within array 12. Note that in FIG. 1B, the catalyst particles are omitted to clearly show the array 12 of semiconductor nanowires 14.

In one embodiment of the invention, the structure shown in FIGS. 1A-1B is formed by first providing a semiconductor substrate 10 of the first conductivity type. In another embodiment of the invention, it possible to dope the substrate so that it acquires the desired conductivity type after the nanowires 14 are formed. Notwithstanding which of the aforementioned embodiments is employed, the conductivity type of the semiconductor substrate 10 may be p-type, or n-type, with n-type being highly preferred. The semiconductor substrate is comprised of any semiconductor material including, for example, silicon, SiGe, SiGeC, SiC, Ge, Ge alloys, CaAs, InAs, InP and other III/V or II/VI compound semiconductors may be used. In addition to these listed types of semiconducting materials, the present invention also contemplates cases in which the semiconductor substrate is a layered semiconductor such as, for example, Si/SiGe, Si/SiC, silicon-on-insulators (SOIs) or silicon germanium-on-insulators (SGOIs). Of the various semiconductor materials mentioned above, it is preferred that the semiconductor substrate is a Si-containing semiconductor material (i.e., a semiconductor material including silicon), with silicon substrates being highly preferred.

The semiconductor substrate employed in the invention may have any crystallographic (herein after "crystal") orientation. In a preferred embodiment, the semiconductor substrate is a Si-containing semiconductor material having a (111), (100) or (110) crystal orientation. In a highly preferred embodiment of the invention, the semiconductor substrate is a Si-containing semiconductor material, preferably, silicon, having a (111) crystal orientation. The use of silicon having a (111) crystal orientation is highly preferred in the invention since such a crystal orientation provides a good control over the vertical growth of semiconductor nanowires. When the p-i-n photodetector is integrated with CMOS and the CMOS devices are fabricated on the SOI layer and the detector is formed on the substrate, the SOI layer will typically have a (100) orientation and the substrate will have a (111) orientation. When the p-i-n photodetector is integrated with CMOS and the CMOS devices are fabricated on the substrate and the detector is formed on the SOI layer, the SOI layer will typically have a (111) orientation and the substrate will have a (100) orientation.

In one embodiment, the semiconductor substrate 10 of the first conductivity type is formed by first providing an undoped semiconductor substrate and thereafter introducing dopants of the first conductivity type into at least a region of the substrate in which the inventive photodetector will be subsequently formed. As stated above, and in another embodiment of the invention, the dopants of the first conductivity type can be introduced into the semiconductor substrate after nanowire growth. The dopants of the first conductivity type may be p-type dopants (i.e., a dopant from Group IIIA of the Periodic Table of Elements, e.g., one of B, Ga and In, with B being a highly preferred p-type dopant) or n-type dopants (i.e., a dopant from Group VA of the Periodic Table of Elements, e.g., one of P, As, or Sb, with P being a highly preferred n-type dopant). In a highly preferred embodiment of the present invention, the semiconductor substrate 10 of the first conductivity type includes n-type dopants, with P dopants being highly preferred.

The concentration of dopants of the first conductivity type within semiconductor substrate 10 is on the order of about $5 \times 10^{18}$ atoms/cm$^3$ or greater, with a concentration of dopants of the first conductivity type within semiconductor substrate 10 from about $1 \times 10^{19}$ to about $5 \times 10^{20}$ atoms/cm$^3$ being even more preferred. In a highly preferred embodiment, and when the dopants of the first conductivity type are P, the semiconductor substrate 10 has a P dopant concentration from about $1 \times 10^{19}$ to about $5 \times 10^{20}$ atoms/cm$^3$.

The dopants of the first conductivity type may be introduced into the semiconductor substrate either before or after nanowire growth utilizing any semiconductor doping technique that is well known to those skilled in the art. For example, the dopants of the first conductivity type may be introduced into the semiconductor substrate by ion implantation, gas phase doping, out diffusion of dopants from a sacrificial layer formed atop the substrate or any combination of these doping technique. It is again observed that in the drawings of the present application, the entirety of the semiconductor substrate 10 is illustrated as containing the first conductivity type dopants. Although such an embodiment is shown and illustrated, the dopants of the first conductivity type may be introduced into regions of the semiconductor substrate 10 in which the inventive photodetector is to be formed.

After providing the semiconductor substrate (doped or undoped), the array 12 of semiconductor nanowires 14 of the first conductivity type is formed vertically on the surface of the semiconductor substrate. Prior to forming the array 12 of semiconductor nanowires 14, the surface of the semiconductor substrate is precleaned to remove any native oxide and/or other contaminants that will not allow the nanowires to mimic the crystal orientation of the semiconductor substrate. The preclean step employed in the present invention includes any technique that can remove native oxide and/or other contaminates from the surface of the semiconductor substrate. For example, the preclean step may include, an RCA clean and etching in DHF prior to depositing the catalyst. It is also possible to desorb the native oxide by annealing the substrate at a temperature of about 700° C. (or higher) in vacuum and then transferring the substrate to a different chamber while maintaining vacuum or a non-oxidizing ambient where the catalyst is deposited in the form of a thin film over the substrate's surface. The thin catalyst film is then patterned into an array of catalyst dots where subsequent growth of nanowires is desired.

The catalyst dots are formed in a grid on the area of the semiconductor substrate where subsequent growth of nanowires is desired. The catalyst that can be used in aiding in the formation of the semiconductor nanowires includes, but is not limited to Au, Ga, Al, Ti and Ni. Preferably, Al or Au is used as the catalyst material.

The catalyst dots used in growing the semiconductor nanowires 14 can also be formed by other techniques such as evaporation of a metal through pores in a mask. The pores in the mask, which define the size of the catalyst dots, are typically too small to form with current optical lithographic techniques. As a result, self-assembly methods for patterning the masks, such as reported in K. Guarini et al. IEDM 2003, p. 541 (2003) and U.S. Patent Application Publication No. 2004/0256662 A1, publication date Dec. 23, 2004, from a diblock co-polymer can also be used.

The array 12 of semiconductor nanowires 14 is then grown perpendicular to the substrate surface. The growth of the semiconductor nanowires 14 is assisted by the catalyst dots and is typically carried out by chemical vapor deposition (CVD) or plasma enhanced chemical vapor deposition (PECVD). The growth temperature depends on the semiconductor nanowire precursor used. For example, when silane (SiH$_4$) is used to grow silicon nanowires, the growth temperature is typically from about 370° C. to about 500° C. For other precursors such as, for example, silicon tetrachloride (SiCl$_4$), the growth temperature is typically from about 800° C. to about 950° C. By adding chlorine to SiH$_4$, the growth temperature can be raised to above 600° C. The growth rate of the nanowires 14 depends on the growth temperature and the gas pressure in the growth chamber. For example, a typical CVD growth rate of silicon nanowires grown with SiH$_4$ diluted with H$_2$ (1:1) at a pressure of 1 torr and a growth temperature of 450° C. is about 7.6 μm/hour.

The anisotropic growth of the semiconductor nanowires is believed to be best described by the vapor-liquid-solid (VLS) mechanism. See, for example, E. I. Givargizov, "Highly Anisotropic Crystals", Kluwer Academic Publishers, Norwell, Mass., 1986. When the growth is initiated, a metallic-semiconductor (typically a gold-silicon) liquid alloy is formed. With additional supply of semiconductor precursor from the gas phase (e.g., SiH$_4$), the metallic-semiconductor droplet becomes supersaturated with semiconductor material and the excess semiconductor is deposited at the solid-liquid interface. As a result, the liquid droplet rises from the original substrate surface to the tip of a growing nanowire crystal. After semiconductor nanowire 14 growth, the metallic semiconductor liquid alloy will separate during cooling without forming a metal semiconductor solid alloy. As a result the liquid alloy reverts back to a catalyst particle 16 after cooling.

The orientation of each of the nanowires 14 matches that of underlying semiconductor substrate since it is seeded from that layer For example, when the underlying semiconductor substrate has a (111) orientation then the semiconductor nanowire 14 orientation is (111) as it is seeded from the semiconductor substrate. The fabrication of the nanocrystals by nanowire growth facilitates the formation of nanocrystals with near identical length, size, and orientation.

The semiconductor nanowires 14 that are formed may comprise the same or different, preferably, the same, semiconductor material as that found within semiconductor substrate. In a preferred embodiment of the invention, the semiconductor nanowires are comprised of a Si-containing semiconductor material, with silicon nanowires being highly preferred.

As stated above, the semiconductor nanowires 14 that are formed are of the first conductivity type (i.e., n-type or p-type, with n-type nanowires being highly preferred). The dopant of the first conductivity type may be introduced to the nanowires during the growth of the nanowires itself i.e., utilizing an in-situ doping growth process, or the dopants of the first conductivity type may be introduced into the semiconductor nanowires 14 after growing the semiconductor nanowires utilizing an ex-situ doping technique. It is observed that the ex-situ doping technique used here can also be used to dope the semiconductor substrate. Ex-situ doping includes ion implantation, gas phase doping, out diffusion of dopants from a sacrificial layer formed about the grown nanowires or any combination of these doping technique. In-situ doping includes the use of a precursor such as phosphine ($PH_3$) for n-type doping, which is co-flowed with silane during the nanowires growth. Other precursors such as tertiarybutylarsine (TBAs) and -phosphine (TBP) can also be used.

Notwithstanding the conductivity of the semiconductor nanowires 14, the semiconductor nanowires 14 have a dopant concentration of the first conductivity type of about $5 \times 10^{18}$ atoms/cm$^3$ or greater, with a dopant concentration of the first conductivity type from about $1 \times 10^{19}$ to about $5 \times 10^{20}$ atoms/cm$^3$ being even more preferred. In a highly preferred embodiment, the semiconductor nanowires 14 of the first conductivity type are doped with P and the concentration of P within the semiconductor nanowires is from about $1 \times 10^{19}$ to about $5 \times 10^{20}$ atoms/cm$^3$.

The semiconductor nanowires 14 that are formed have a length, l, as measured from the base of the semiconductor substrate 10 to the tip of from about 200 to about 20000 nm, with a length from about 1000 to about 10000 nm being even more typical. The spacing of one semiconductor nanowire to a neighboring nanowire, represented as D, is from about 100 to about 2000 nm, with a spacing from about 200 to about 1000 nm being even more typical.

Next, the reformed catalyst particles 16 are removed from the tip of each of the semiconductor nanowires 14 by selective etching. For example, aqua regia (a mixture of nitric acid and hydrochloric acid) will selectively etch the catalyst particles 16 from the tip of each of the semiconductor nanowires 14. The surfaces (top and sidewalls) of the semiconductor nanowires 14 and the underlying semiconductor substrate 10 are cleaned to remove any native oxide therefrom utilizing a stripping process that is well known to those skilled in the art.

Figure 2A:
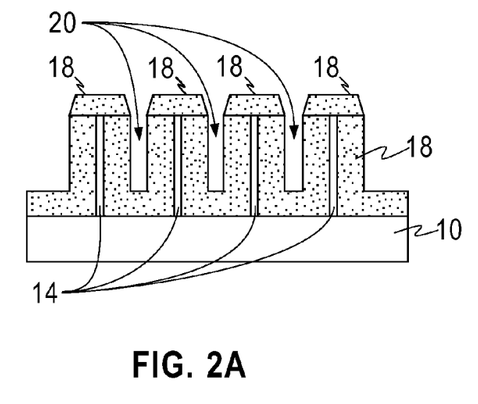
FIGS. 2A-2B are pictorial representations (through a cross sectional view and a top down view, respectively) of the structure shown in FIGS. 1A-1B after epitaxially growing an intrinsic semiconductor film, in accordance with the present invention.
Figure 2B:
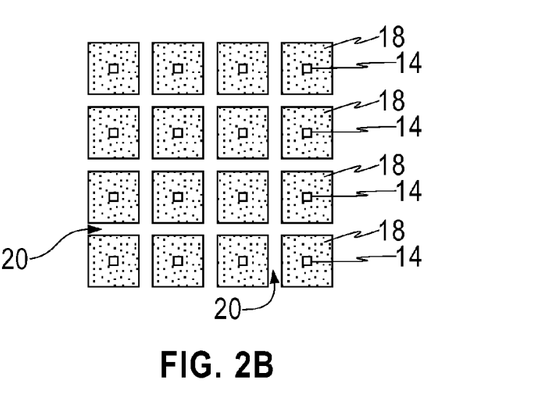

Next, and as shown in FIGS. 2A-2B, an intrinsic semiconductor material 18 is formed on the exposed and now cleaned surface of the semiconductor substrate 10 as well as the exposed surfaces (top and sidewalls) of each of the semiconductor nanowires 14. Typically, the intrinsic semiconductor material 18 is formed utilizing an epitaxial growth process. The epitaxial growth process includes the use of gaseous or liquid semiconductor-containing precursors. Although the conditions for the epitaxial growth of the intrisnic semiconductor material 18 may vary and include those well known to those skilled in the art, the following represent preferred conditions that can be used in the present invention in forming an intrinsic silicon layer: A wet clean such as an RCA clean followed by an DHF last etching for removal of a native oxide is used prior to loading the substrate into a growth chamber. An optional oxide desorption step is performed by briefly annealing the wafer in the growth chamber at a temperature of 700° C. (or higher). The growth of the intrisnic semiconductor material 18 is performed following the oxide desorption step without exposing the wafer to an oxidizing ambient. When the intrisnic semiconductor material 18 is epitaxial silicon, CVD precursors such as $SiH_4$, or $SiCl_4$ can be used to deposit silicon epitaxialy. For these precursursor the typical growth temperature is about 800°-1000° C. The intrisnic semiconductor material 18 can also include germanium. The germanium can be incorporated into layer 18 by using a precursor such as germane ($GeH_4$).

The intrinsic semiconductor material 18 may be comprised of the same or different, preferably, the same semiconductor material as the semiconductor nanowires and the underlying semiconductor substrate 10. Because epitaxial growth is employed, the intrinsic semiconductor material 18 has the same crystal orientation as that of the semiconductor nanowires 14 and the underlying semiconductor substrate 10. It is observed that the growth of the intrinsic semicondutor material 18 occurs until almost (but not all) of the gap between neighboring semiconductor nanowires 16 is filled. In FIG. 2A, reference numeral 20 denotes a gap between neighboring semiconductor nanowires 16 that remains unfilled with intrinsic semiconductor material 18. While unintentionaly doped, the intrinsic semiconductor material 18 may include a small amount of dopants of either n-type or p-type conductivity. The unintentional doping level is typically less than $5 \times 10^{17}$ atoms/cm$^3$.

Figure 3A:
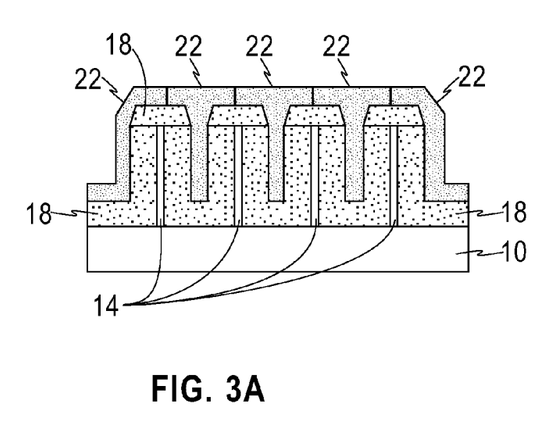
FIGS. 3A-3B are pictorial representations (through a cross sectional view and a top down view, respectively) of the structure shown in FIGS. 2A-2B after forming a semiconductor material of a second conductivity type that is opposite to the first conductivity type, in accordance with the present invention.
Figure 3B:
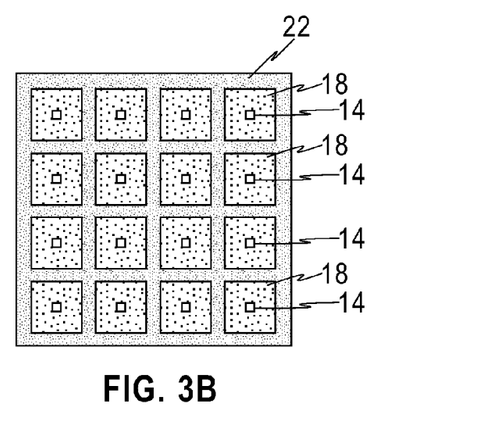

Next, and as shown in FIGS. 3A-3B, a semiconductor material 22 of a second conductivity type (which is different, i.e., opposite, from the first conducivity type) is formed on a surface of the intrinsic semiconductor material 18. It is also observed that the semiconductor material 22 of the second conducivity type fills the remaining gap 20 between neighboring semiconductor nanowires 14. The semiconductor material 22 of the second conductivity type may be comprised of the same or different, preferably the same semiconductor material as that of the intrinsic semiconductor material 18, the semiconductor nanowires 14, and the underlying semiconductor substrate 10. Preferably, each of elements 10, 14, 18, and 22 is comprised of a Si-containing semiconductor, with silicon being most preferred.

The semiconductor material 22 of the second conductivity type may be formed utilizing the epitaxial growth method mentioned above. The dopant of the second conductivity type may be introduced in-situ during the epitaxial growth of semiconductor material 22. Alternatively, the dopant of the second conductivity type may be introduced after the epitaxial growth of the semiconductor material 22 utilizing one of the ex-situ doping techniques mentioned above. It is observed that the formation of semiconductor material 22 of the second conductivity type may be formed within the same reactor chamber as used in forming the intrinsic semiconductor material 18 without breaking vacuum. Alternatively, vacuum can be broken between the deposition of materials 18 and 22. As an example, p-type in-situ doping of the semiconductor material 22 is obtained by co-flowing $SiH_4$ and diborane ($B_2H_6$) when CVD is used to deposit the semiconductor material 22.

Notwithstanding the conductivity of the semiconductor material 22, the semiconductor material 22 has a dopant concentration of the second conductivity type of about $5\times10^{18}$ atoms/cm$^3$ or greater, with a dopant concentration of the second conductivity type from about $1\times10^{19}$ to about $5\times10^{20}$ atoms/cm$^3$ being even more preferred. In a highly preferred embodiment, the semiconductor material 22 of the second conductivity type is doped with B and the concentration of B within the semiconductor material 22 is from about $1\times10^{19}$ to about $5\times10^{20}$ atoms/cm$^3$.

It is observed that when an epitaxial semiconductor front "runs into" another epitaxial semiconductor front (a process that happens as the gaps are filled in the present invention) a defect is formed. These defects do not, however, affect device performance since in the inventive structure they are confined to the semiconductor material 22 of the second conductivity type. If such a defect was formed within the intrinsic semiconductor material 18, it may reduce the life-time of the photo-generated carriers.

It is also possible to offset the electrical p-i and i-n junctions from the metallurgical junctions. The metallurgical junctions are defined as the contact surface between the semiconductor nanowires 14 and the intrinsic semiconductor material 18 and similarly the contact surface between the intrinsic semiconductor material 18 and the semiconductor material 22. The p-i and i-n electrical junctions are formed where a transition from doped semiconductor to intrinsic semiconductor occurs. One method to introduce an offset is by annealing the structure. At an elevated temperature the dopants in the semiconductor nanowires 14 and similarly in semiconductor material 22 will redistribute by diffusion and move into the intrinsic semiconductor material 18. The amount by which the dopants will advance beyond the metallurgical junction depends on the annealing temperature, the annealing time and the doping species. Another method to introduce an intentional offset is to dope the inner and outer portions of the intrinsic semiconductor material 18. This is done by in-situ doping the intrinsic semiconductor material 18 upon the start of the growth with a dopant that provides the conductivity of the first type, then continue the growth without doping to form the middle intrinsic portion of the layer, and then form the outer portion of the intrinsic semiconductor material 18 by in-situ doping with a dopant that provides the conductivity of the second type.

It is again observed that the inventive method provides a p-i-n photodetector that includes an array 12 of semiconductor nanowires 14 of a first conductivity type disposed vertically on a surface of an underlying semiconductor substrate 10 also of the first conductivity type. The dopants of the first conductivity type can be introduced into the semiconductor substrate either before or after nanowire growth, The inventive structure also includes an intrinsic semiconductor material 18 located on the surface of the semiconductor substrate 10 and surrounding each semiconductor nanowire 14 of the array 12. A semiconductor material 22 of a second conductivity type (which is opposite to the first conductivity type) is located on a surface of the intrinsic semiconductor material 18 filling remaining gaps between neighboring semiconductor nanowires.

Figure 4A:
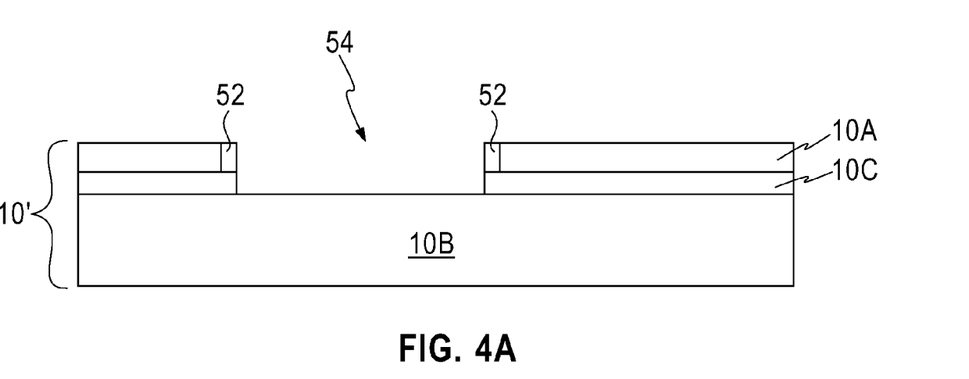
FIGS. 4A-4B are pictorial representations (through cross sectional views) depicting the integration of the inventive lateral p-i-n photodetector structure and method with SOI CMOS technology.
Figure 4B:
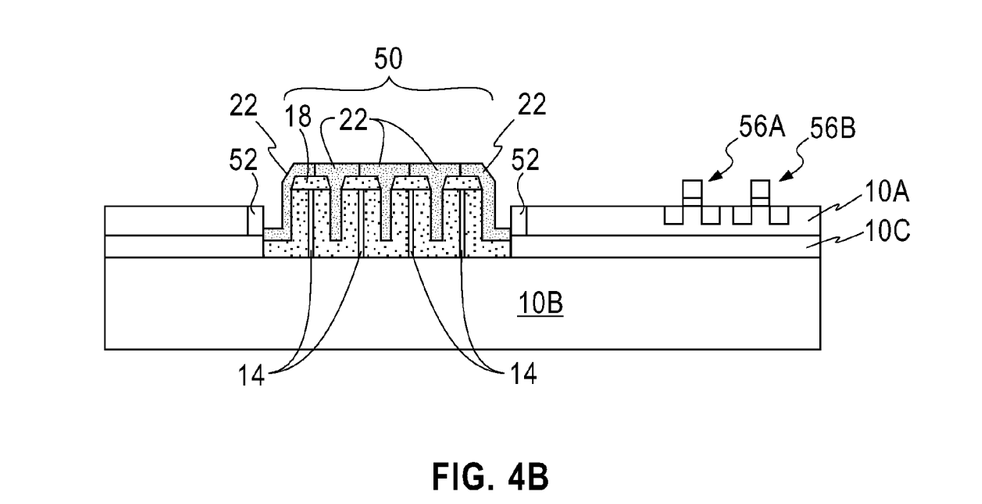

FIGS. 4A-4B illustrate the integration of the inventive photodetector 50 with at least one semiconductor device, e.g., CMOS transistors 56A and 56B on a semiconductor-on-insulator (SOI) substrate 10'. The SOI substrate 10' includes a top semiconductor layer 10A and a bottom semiconductor layer 10B of a first conductivity type that are separated by a buried insulating layer 10C. The top and bottom semiconductor layers may be comprised of the same or different, preferably the same semiconductor material, with Si-containing semiconductors, particularly silicon, being highly preferred.

The top and bottom semiconductor material may have the same or different, preferably different crystal orientations. For example, the top semiconductor layer 10A may comprise Si and having a (100) crystal orientation, while the bottom semiconductor layer 10B may comprise Si of a first conductivity type and having a (111) crystal orientation. In the embodiment illustrated, the foregoing arrangement is assumed.

The buried insulating layer 10C of the SOI substrate 10' may comprise a crystalline or non-crystalline, preferably, amorphous oxide, nitride, oxynitride or multilayered stack thereof. Preferably, the buried insulating layer 110C is a buried oxide.

The SOI substrate 10' is formed utilizing conventional bonding techniques that are well known to those skilled in the art Introduction of the dopant atoms of either the first or second conductivity type into the bottom semiconductor layer is performed prior to wafer bonding using the techniques described above. The dopants can also be incorporated by a masked ion implantation after the top surface of bottom semiconductor layer 10B has been exposed in region 54.

After wafer bonding, a trench isolation region 52 may be formed into at least the top semiconductor layer 10A of the SOI substrate 10' utilizing techniques well known to those skilled in the art. Next, lithography and etching are used to provide a trench opening 54 within the top semiconductor layer 10A and the buried insulating layer 10C so as to expose an upper surface of the bottom semiconductor layer 10B. The resultant structure that is formed is illustrated in FIG. 4A. Next, the inventive photodetector 50 including all of the elements shown in FIG. 3A and as described above is formed on the exposed surface of the bottom semiconductor layer 10B, while the CMOS transistors 56A and 56B are formed on the top semiconductor layer 10A utilizing techniques and materials that are well known to those skilled in the art. Photodetector 50 and the CMOS transistors 56A and 56B can be fabricated sequentially; however, to minimize the total thermal budget to either device an integrated process is highly preferred. Block masks are used to block the areas of the substrate in which either the photodetector or the CMOS transistors are to be absent from when a process unique to one device, but not the other, is performed. The resultant structure including the inventive photodetector 50 and the CMOS transistors 56A and 56B integrated on an SOT substrate 10 is shown in FIG. 4B.

Figure 5A:
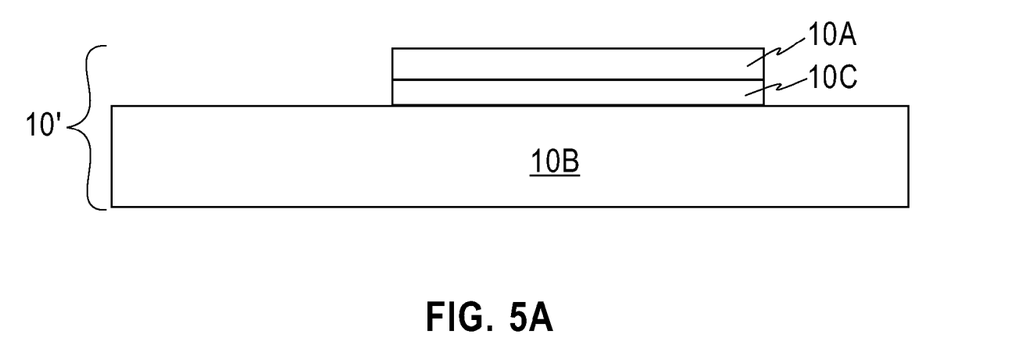
FIGS. 5A-5B are pictorial representations (through cross sectional views) depicting the integration of the inventive lateral p-i-n photodetector structure and method with bulk CMOS technology.
Figure 5B:
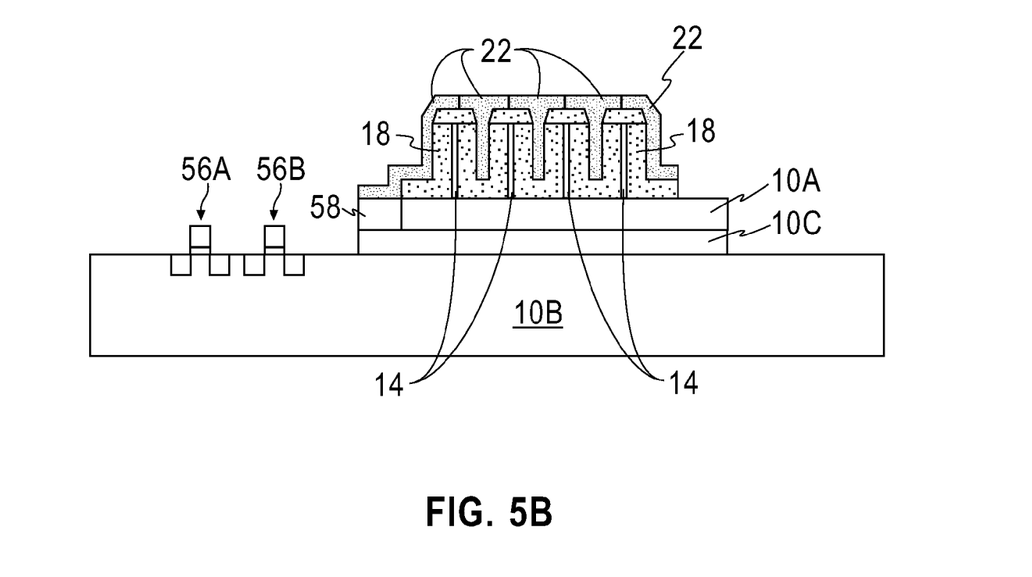

FIGS. 5A-5B also illustrate the integration of the inventive photodetector 50 with at least one semiconductor device, e.g., CMOS transistors 56A and 56B on a bulk substrate, i.e., the bottom semiconductor substrate 10B of the semiconductor-on-insulator (SOI) substrate 10'. This resultant structure of this embodiment differs from the one shown in FIGS. 4A-4B since the inventive photodetector 50 is now formed on the upper surface semiconductor layer of the SOI substrate 10'. In this embodiment, a SOI substrate 10' is also provided as described above. However, in the illustrated embodiment, the top semiconductor layer 10A is silicon of the first conductivity type and has a (111) crystal orientation, while the bottom semiconductor layer 10B is silicon and has a (100) crystal orientation.

As shown in FIG. 5A, the top semiconductor layer 10A and the buried insulating layer 10C are patterned by lithography and etching. Next, the inventive photodetector 50 including all of the elements shown in FIG. 3A and as described above is formed on the exposed surface of the top semiconductor layer 10A, while the CMOS transistors 56A and 56B are formed on the bottom semiconductor layer 10B utilizing techniques and materials that are well known to those skilled in the art. The sequence of forming the photodetector and the CMOS transistors 56A and 56B may vary, with the sequence of first forming CMOS transistors 56A and 56B and then forming the photodetector 50 being highly preferred in order to minimize processing issues related to topography. Block masks are used to block the areas of the substrate in which either the photodetector or the CMOS transistors are to be absent from, The resultant structure including the inventive photodetector 50 and the CMOS transistors 56A and 56B is shown in FIG. 5B. Note that in FIG. 5B, reference numeral 58 denotes an oxide pad that is formed by shallow trench isolation (STI).

While not shown in the figures, contacts are typically formed to the semiconductor material 22 of the second conductivity type and substrate 10 of FIG. 3A, or the layer 22 and doped region of layer 10B of FIG. 4B, or the semiconductor material 22 of the second conductivity type and the top semiconductor layer 10A of FIG. 5B. Contacts are made in the n-region and p-region of the p-i-n photodetector. As it is the case with any photodetector, the contacts layout is designed such that it will not block the light that needs to be detected. Keeping a window free of metallization over the photodetector is especially important when the detector is integrated with CMOS, which typically uses several layers of interconnects.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A p-i-n photodetector comprising:
   an array of semiconductor nanowires having a first conductivity type dopant present within an entirety of each of the semiconductor nanowires, the array of semiconductor nanowires disposed vertically on a surface of an underlying semiconductor substrate of said first conductivity type;
   an intrinsic semiconductor material located on said surface of said semiconductor substrate and directly on a top surface and sidewall surfaces of each semiconductor nanowire of said array; and
   a semiconductor material of a second conductivity type located directly on a surface of said intrinsic semiconductor material, wherein said second conductivity type is different from said first conductivity type, and said array of semiconductor nanowires having the first conductivity type and the semiconductor material of the second conductivity type provide p-type and n-type elements of the p-i-n photodetector and the intrinsic semiconductor material separates the p-type and n-type elements of the p-i-n photodetector, and wherein a portion of said semiconductor material of said second conductivity is spaced apart from the surface of the underlying semiconductor substrate by a portion of said intrinsic semiconductor material that is located on said surface of said underlying semiconductor substrate.

2. The p-i-n photodetector of claim 1 wherein said semiconductor material of the second conductivity type fills a gap between adjacent regions of an intrinsic semiconductor material.

3. The p-i-n photodetector of claim 1 wherein all surfaces surrounding said semiconductor nanowires are eliminated by addition of said intrinsic semiconductor material and said semiconductor material of the second conductivity type.

4. The p-i-n photodetector of claim 1 wherein said first conductivity type is n-type and said second conductivity type is p-type.

5. The p-i-n photodetector of claim 1 wherein each semiconductor nanowire of said array includes a first dopant concentration of said first conductivity type of greater than $5 \times 10^{18}$ atoms/cm$^3$ and said semiconductor material of said second conductivity type has a second dopant concentration of greater than $5 \times 10^{18}$ atoms/cm$^3$.

6. The p-i-n photodetector of claim 1 wherein each semiconductor nanowire of said array comprises a Si-containing semiconductor material.

7. The p-i-n photodetector of claim 1 wherein said intrinsic semiconductor material and said semiconductor material of a second conductivity comprise the same Si-containing semiconductor material.

8. The p-i-n photodetector of claim 1 wherein said semiconductor substrate is a bulk semiconductor material.

9. The p-i-n photodetector of claim 1 wherein said semiconductor substrate is a semiconductor-on-insulator (SOI) substrate, and said array of semiconductor nanowires is located on an SOI layer of the SOI substrate.

10. The p-i-n photodetector of claim 1 wherein said semiconductor substrate is a semiconductor-on-insulator (SOI) substrate, and said array of semiconductor nanowires is located on a bottom semiconductor layer of the SOI substrate.

11. A semiconductor structure comprising the p-i-n photodetector of claim 1 and at least one other semiconductor device located on said surface of said semiconductor substrate.

12. The semiconductor structure of claim 11 wherein said at least one other semiconductor structure is a transistor.

13. A p-i-n photodetector comprising:
   an array of n-type doped silicon nanowires disposed vertically on a surface of an underlying n-type doped silicon substrate, wherein an entirety of said n-type doped silicon nanowires is doped to an n-type conductivity and provides the n-type element of the p-i-n photodetector, said n-type doped silicon substrate having a (111) crystal orientation;
   a layer of intrinsic silicon located on said surface of said n-type doped silicon substrate and directly on a top surface and sidewall surfaces of each n-type doped silicon nanowire of said array; and
   a layer of p-type doped silicon located directly on a surface of said layer of intrinsic silicon that provides the p-type element of the p-i-n photodetector, wherein a portion of said layer of p-type doped silicon is spaced apart from the surface of the underlying n-type doped silicon substrate by a portion of said layer of intrinsic silicon that is located on said surface of said underlying n-type doped silicon substrate.

* * * * *